(12) United States Patent
Zanetta et al.

(10) Patent No.: US 8,901,991 B2
(45) Date of Patent: Dec. 2, 2014

(54) POWER MONITORING CIRCUITRY

(71) Applicant: Freescale Semiconductor, Inc., Austin, TX (US)

(72) Inventors: Pedro Barbosa Zanetta, Campinas (BR); Ivan Carlos Ribeiro Nascimento, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/848,348

(22) Filed: Mar. 21, 2013

(65) Prior Publication Data

US 2014/0285239 A1     Sep. 25, 2014

(51) Int. Cl.
    *H03K 17/00*     (2006.01)
(52) U.S. Cl.
    USPC ............................ 327/407; 327/408; 307/80
(58) Field of Classification Search
    USPC ................................. 327/407, 408; 307/80
    See application file for complete search history.

(56) References Cited

U.S. PATENT DOCUMENTS

| | | | | |
|---|---|---|---|---|
| 4,617,473 | A | * | 10/1986 | Bingham ..................... 307/66 |
| 5,157,291 | A | * | 10/1992 | Shimoda ..................... 327/408 |
| 5,608,273 | A | * | 3/1997 | Bartlett ........................ 307/64 |
| 5,748,033 | A | * | 5/1998 | Kaveh et al. ................. 327/545 |
| 6,359,497 | B1 | | 3/2002 | Criscione |
| 6,847,249 | B1 | * | 1/2005 | Brokaw ....................... 327/408 |
| 7,129,600 | B2 | | 10/2006 | Wu et al. |
| 7,142,038 | B2 | * | 11/2006 | Baglin ......................... 327/407 |
| 7,298,181 | B2 | * | 11/2007 | Khan et al. .................. 327/70 |
| 7,443,199 | B2 | * | 10/2008 | da Fonte Dias et al. ...... 326/68 |
| 7,893,566 | B2 | * | 2/2011 | Yarbrough et al. ........... 307/130 |
| 8,129,862 | B2 | * | 3/2012 | Audy ............................ 307/80 |
| 8,164,378 | B2 | | 4/2012 | Pietri et al. |
| 2003/0090158 | A1 | * | 5/2003 | Fauh et al. ..................... 307/87 |

* cited by examiner

*Primary Examiner* — Kenneth B. Wells
(74) *Attorney, Agent, or Firm* — Luiz von Paumgartten; Fogarty, L.L.C.

(57) ABSTRACT

Power monitoring circuitry. In some embodiments, comparator circuitry may be configured to receive a first voltage value and a second voltage value, and to identify the greater of the first and second voltage values. Selector circuitry coupled to the comparator circuitry may be configured to power one or more components within the comparator circuitry with a supply voltage corresponding to the greater voltage value. In other embodiments, a method may include identifying, via a comparator, the largest among a plurality of voltage values, and powering one or more logic components within the comparator with the identified voltage value.

17 Claims, 8 Drawing Sheets

POWER MONITORING CIRCUITRY

FIELD

This disclosure relates generally to electronic devices, and more specifically, to power monitoring circuitry.

BACKGROUND

A complementary metal-oxide-semiconductor (CMOS) transistor can be modeled as a four-terminal (body, gate, source, and drain) device on a silicon substrate.

To turn off a "p-type" transistor and reduce unintended electrical currents, the gate terminal of the transistor may be biased with a voltage ("$V_G$") equal to or higher than the largest voltage between the transistor's source ("$V_S$") and drain ("$V_D$") voltages. Similarly, to avoid undesirable circuit behaviors due to accidentally forward-biased p-n junctions (e.g., latch-up), the body terminal of the transistor may also be biased with the greater of $V_S$ and $V_D$. Hence, in situations where more than one supply voltage is available, a power monitor circuit may be used to determine the highest available voltage to properly bias these transistors.

As the inventors hereof have recognized, however, due to their high static power consumption, traditional power monitoring circuits are not suitable for use in low-power devices. The problem is compounded in situations where a single electronic device has several independently-powered domains, and therefore require a correspondingly large number of monitoring circuits. When employed in large numbers, the power consumption of monitoring circuits becomes even more significant.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Disclosed herein are power monitoring circuits with reduced static power consumption. In some embodiments, a power monitoring circuit may be used to select a supply voltage to be applied to another circuit or component—for example, a selected voltage may be used to bias a PMOS transistor or the like. More generally, a power monitoring circuit may be configured identify a highest or lowest of two or more different voltage values.

In some implementations, a power monitoring circuit may include a comparator having two cross-coupled CMOS inverters, each inverter powered by one of two supply voltages $V_1$ and $V_2$. In operation, when $V_1$ is greater than $V_2$, the output (INV1) of a first inverter is pulled up to $V_1$ and the output (INV2) of a second inverter is pulled down to a ground reference ($V_{SS}$) voltage. Conversely, when $V_2$ is greater than $V_1$, INV2 is pulled up to $V_2$ and INV1 is pulled down to $V_{SS}$.

First and second Schmitt triggers (or inverters) may be configured to receive INV1 and INV2. Also, the outputs of the first Schmitt trigger ("SCH1") and the output of the second Schmitt trigger ("SCH2") may be respectively coupled to the reset and set active-low inputs of a first SR latch. The non-inverted and inverted outputs of the first SR latch may be coupled to the set and reset inputs of a second SR latch, respectively. Alternatively, another circuitry may replace the two SR latches in series (e.g., a JK latch).

A power switching module may receive the inverted and the non-inverted outputs (V2GREATER) and (V1GREATER) of the second SR latch, as well as the two supply voltages $V_1$ and $V_2$. If $V_1$ is greater than $V_2$, V1GREATER is set to a logic high ("HIGH") and V2GREATER is set to a logic low ("LOW"). On the other hand, if $V_2$ is greater than $V_1$, V2GREATER is set to HIGH and V1GREATER is set to LOW. Then, based on the values of these two flags, the largest of $V_1$ or $V_2$ may be selected. The chosen supply is used to power the first and second Schmitt triggers and/or latches.

Figure 1:
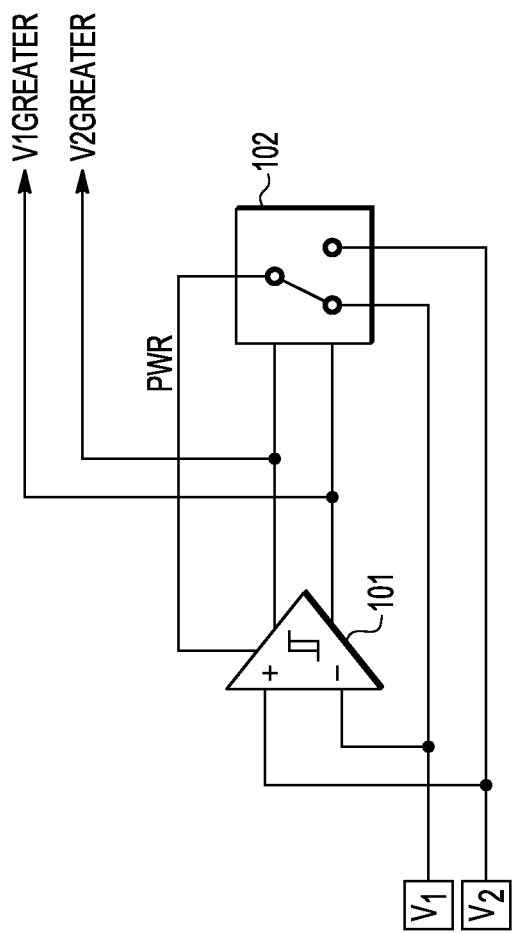
FIG. 1 is a high-level block diagram of an example of a power monitoring circuit according to some embodiments.

FIG. 1 is a high-level block diagram of an example of a power monitoring circuit, according to some embodiments. Specifically, voltage comparator circuit 101 is based upon a regenerative latch having zero static power consumption. Comparator 101 receives input voltages $V_1$ and $V_2$ and generates output flags V1GREATER and V2GREATER. In this implementation, similarly as described above, if $V_1$ is greater than $V_2$, V1GREATER is set to HIGH and V2GREATER is set to LOW. Conversely, if $V_2$ is greater than $V_1$, V2GREATER is set to HIGH and V1GREATER is set to LOW. Based on these flags, power switching or selection circuit 102 couples the larger of $V_1$ and $V_2$ to one or more nodes within comparator 101, here labeled "PWR." The high logic level of flags V1GREATER and V2GREATER are generated with the PWR voltage, which may be either $V_1$ or $V_2$ depending upon which of $V_1$ or $V_2$ has the largest value.

It should be noted that the embodiment of FIG. 1 enables a comparison between two voltage values $V_1$ and $V_2$. However, the same circuitry may be repeated, for example, in a cascaded fashion, in order allow a comparison among any number of voltages. For instance, in the case of a three-way comparison, a first comparator may compare voltages $V_1$ and $V_2$, and a second comparator may subsequently compare the largest of $V_1$ and $V_2$, as determined by the first comparator, against a third voltage value $V_3$. Alternatively, a first comparator may compare $V_1$ and $V_2$, a second comparator may compare $V_2$ and $V_3$, and a third comparator may compare $V_1$ and $V_3$ simultaneously. The outputs of the three comparators may be provided to a logic circuit (not shown) configured to identify which amongst $V_1$, $V_2$, and $V_3$ is the greatest voltage value.

Figure 2:
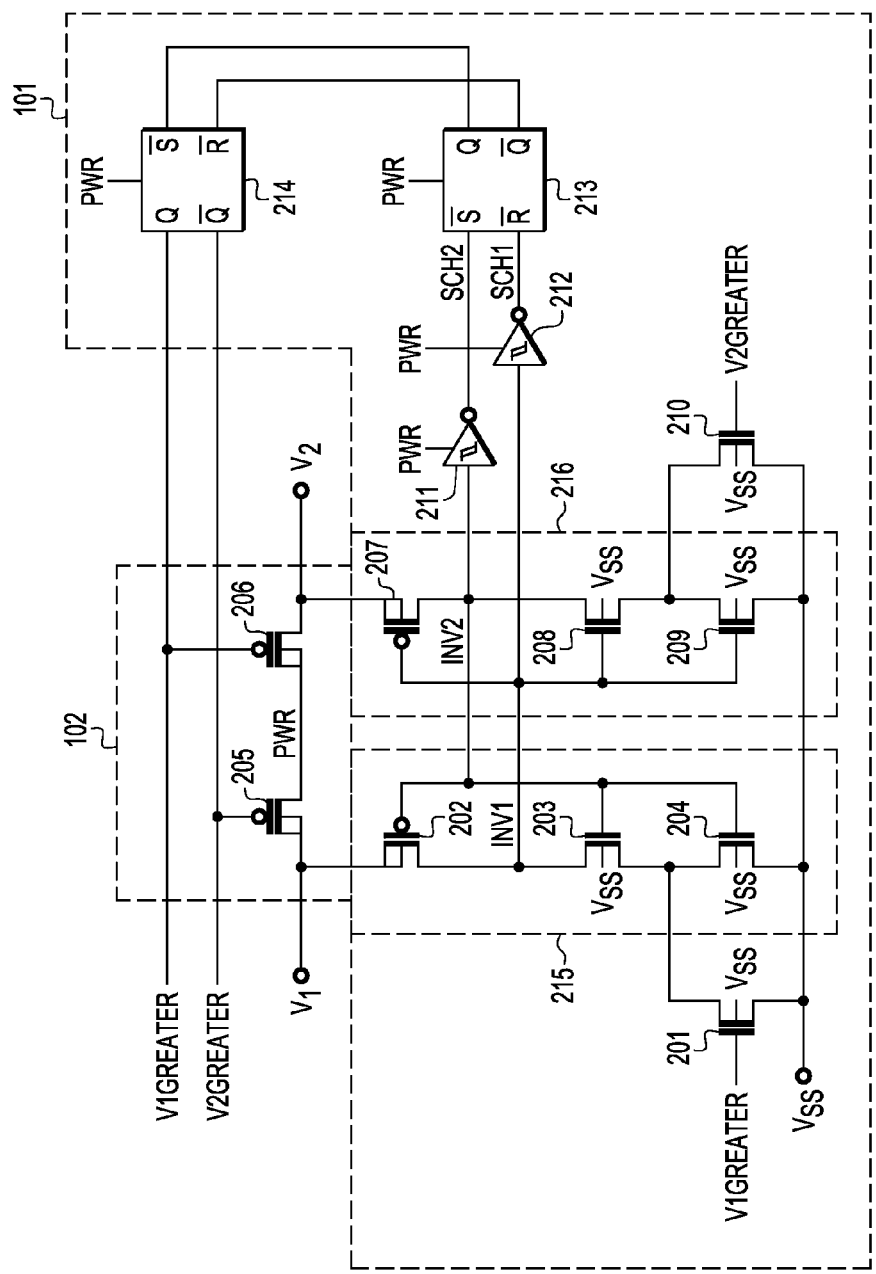
FIG. 2 is a circuit diagram of an example of a power monitoring circuit according to some embodiments.

FIG. 2 is a circuit diagram of an example of a power monitoring circuit. In this embodiment, power switching or selection circuit 102 includes transistors 205 and 206, whereas other components 201-204 and 207-216 are part of comparator circuit 101. Comparator 101 includes first inverter 215 cross coupled with second inverter 216. First inverter 215 includes transistors 202-204, and second inverter 216 includes transistors 207-209. Also, a first voltage $V_1$ is the supply of the first inverter 215 and a second voltage $V_2$ is the supply of the second inverter 216. If $V_1$ is greater than $V_2$, the output ("INV1") of first inverter 215 is pulled up to $V_1$, and the output ("INV2") of second inverter 216 is pulled down to ground reference $V_{SS}$. If $V_2$ is greater than $V_1$, then $INV_2$ is pulled up to $V_2$ and $INV_1$ is pulled down to $V_{SS}$.

First Schmitt trigger 212 receives INV1, and second Schmitt trigger 211 receives INV2. In alternative embodiments, first and second Schmitt triggers 212 and 211 may be replaced with inverters. Outputs SCH1 and SCH2 of first and second Schmitt triggers 212 and 211 are coupled to a reset input ($\overline{R}$) and set input ($\overline{S}$) of first SR latch 213, respectively.

In some situations, such as when $V_1$ and $V_2$ are both below a certain minimum voltage, SCH1 and SCH2 can both be LOW; in which case first SR latch 213 would be an undesirable state such that both its output (Q) and complementary output ($\overline{Q}$) are set to HIGH. Because V1GREATER and V2GREATER control switches 205 and 206, these flags should not be driven to HIGH simultaneously. Otherwise, the PWR node would be in a high-impedance state. To prevent this condition from occurring, second SR latch 214 with active-low inputs may be added in series with first latch 213.

The output (Q) and complementary output ($\overline{Q}$) of first SR latch 213 are coupled to set input ($\overline{S}$) and to the reset input ($\overline{R}$) of second SR latch 214, respectively. The output (Q) of second SR latch 214 generates the V1GREATER flag, and the complementary output ($\overline{Q}$) out second SR latch 214 generates the V2GREATER flag. Alternatively, the two SR latches 213 and 214 may be replaced by a JK latch or the like.

When $V_1$ is greater than $V_2$, NMOS transistor 201 is driven on to increase the strength of the equivalent NMOS transistor formed by 203 and 204, and consequently lower the switching trip-point of first inverter 215. Similarly, if $V_2$ is greater than $V_1$, transistor 210 is driven on to lower the trip-point of second inverter 216. Transistors 204 or 209 may be kept weaker than transistors 203 or 208. Alternatively, the trip-points of inverters 215 and 216 may be controlled by modifying the operation of PMOS transistors 202 and 207 instead.

The largest of $V_1$ or $V_2$ is applied to the PWR node between inverters 215 and 216, and the PWR node also powers logic components within comparator 101—here first Schmitt trigger or inverter 212, second Schmitt trigger or inverter 211, first latch 213 and second latch 214.

Figure 3:
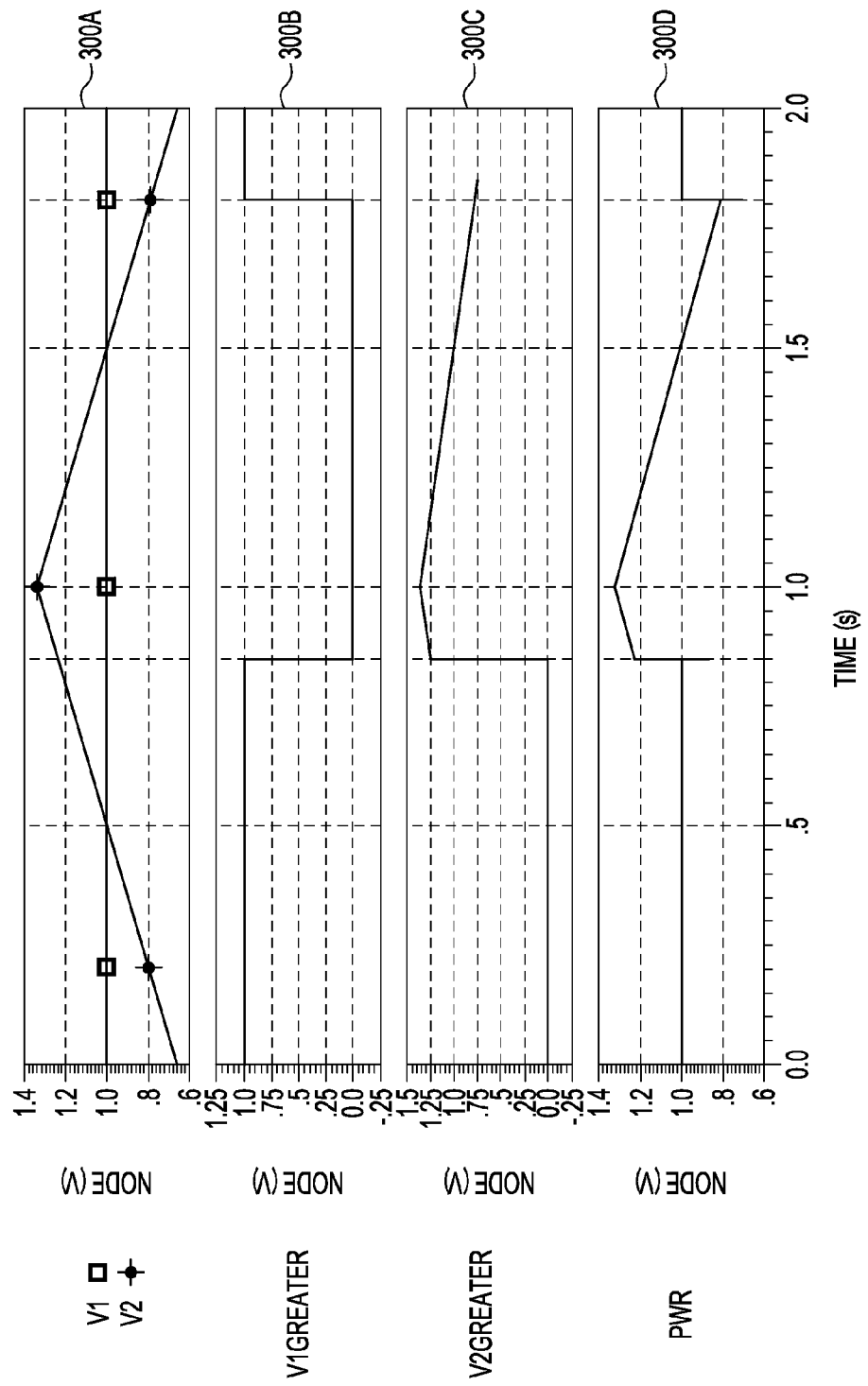
FIG. 3 shows graphs illustrating simulated waveforms output by the power monitoring circuit according to some embodiments.

FIG. 3 shows graphs illustrating simulated waveforms output by the power monitoring circuit of FIG. 2 according to some embodiments. Input supply voltages $V_1$ and $V_2$ vary arbitrarily over time in graph 300A such that $V_1$ remains constant while $V_2$ crosses $V_1$ as it increases and then decreases. Graphs 300B and 300C show the values of flags V1GREATER and V2GREATER, and graph 300D shows the voltage applied by selection circuit 102 to the PWR node(s) of comparator 101.

At t=0, $V_1$ is greater than $V_2$, hence V1GREATER is set to HIGH, V2GREATER is set to LOW, and the PWR node is coupled to $V_1$. When $V_2$ exceeds $V_1$ by approximately 0.2 V at t=0.85 s, V2GREATER is set to HIGH, V1GREATER is set to LOW, and the PWR node is coupled to $V_2$. Then, when $V_2$ is again smaller than $V_1$ by approximately 0.2 V at t=1.8 s, V1GREATER is set HIGH, V2GREATER is set to LOW, $V_1$ is re-coupled to the PWR node.

In the foregoing example, only when $V_2$ is approximately 0.2 V greater than $V_1$ do the flags accurately reflect their status. In some applications including, for example, transistor body biasing, voltage offset margins up to 250 mV may be acceptable. When more precision is desired, however, offset reduction circuitry may be added to the circuit of FIG. 2, as described in more detail below.

Figure 4:
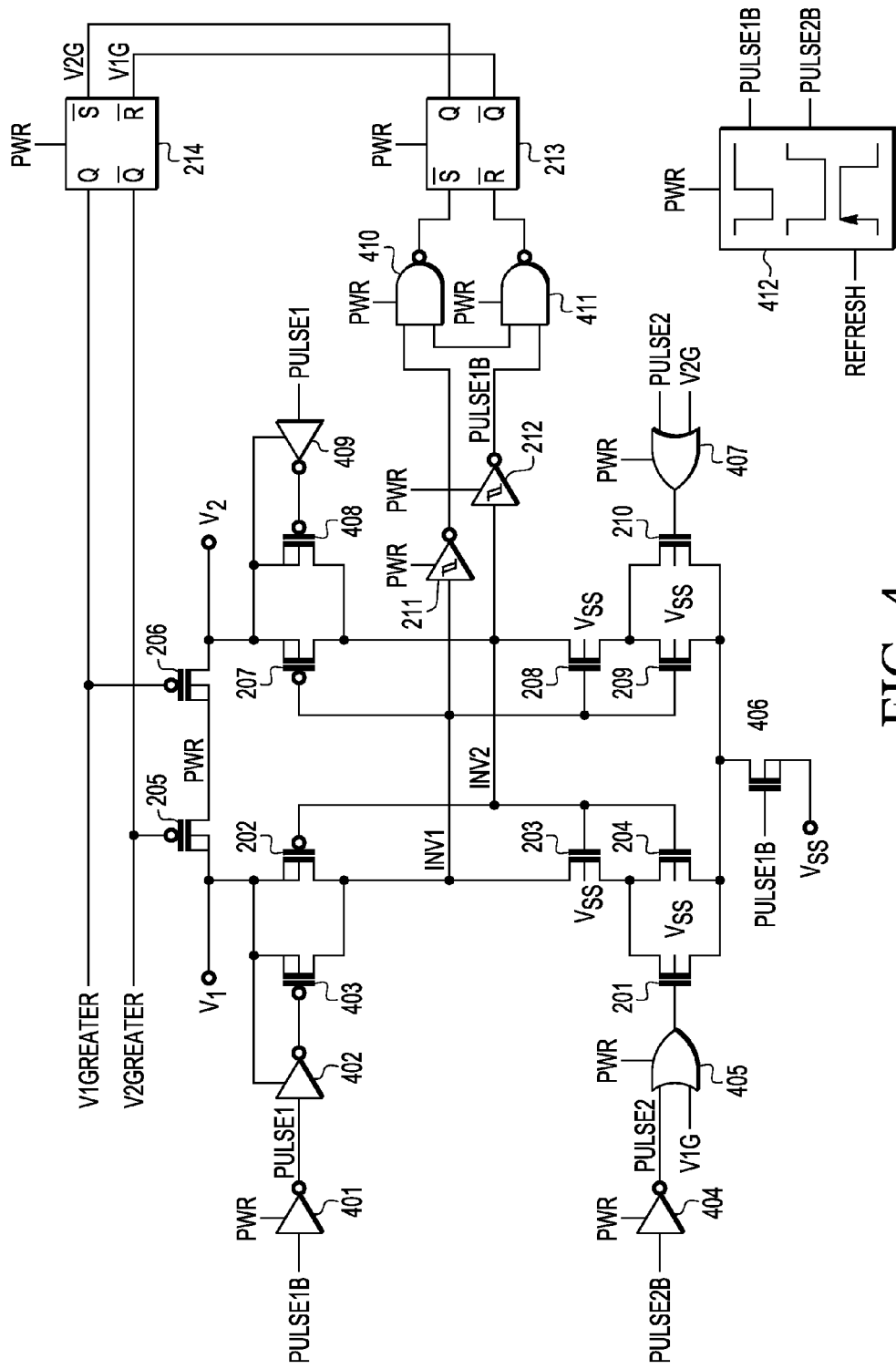
FIG. 4 is a circuit diagram of an example of a power monitoring circuit with offset reduction circuitry according to some embodiments.

FIG. 4 is a circuit diagram of an example of a power monitoring circuit with offset reduction circuitry, according to some embodiments. Here, components carried over from the circuit of FIG. 2 have retained the same numbering for ease of explanation. The circuit of FIG. 4 has two modes of operation. In a first mode of operation, a REFRESH signal is driven LOW (or HIGH and does not have positive edges or does not change over time), and operation is similar to that of the circuit of FIG. 2. In a second mode of operation, the REFRESH signal is driven HIGH (or has a positive edge) to force more accurate voltage comparisons. In some implementations, the REFRESH signal may be driven by a clock signal or the like.

Figure 6:
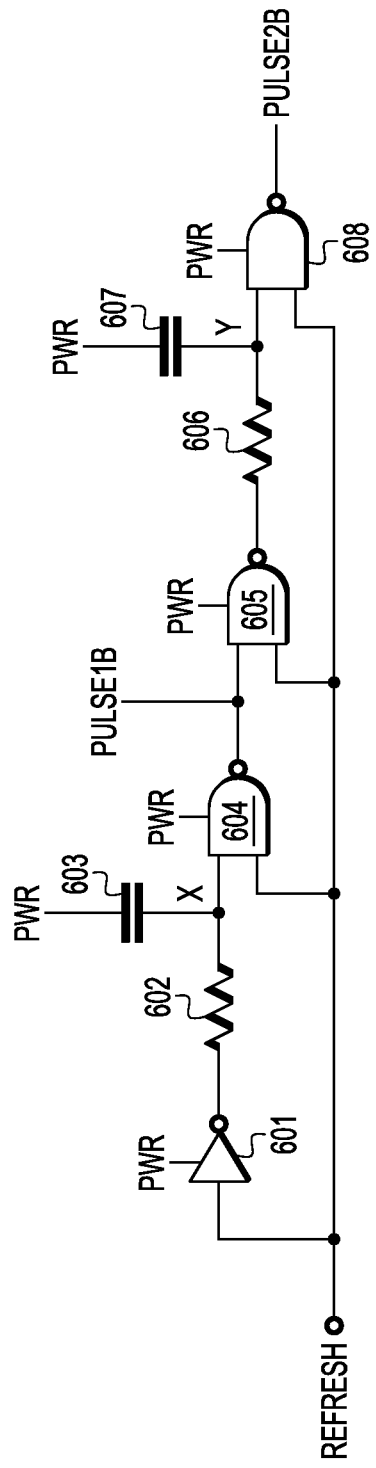
FIG. 6 is a circuit diagram of an example of a pulse generator according to some embodiments.

Pulse generator circuit 412, described in more detail in FIG. 6, is configured to produce two pulses PULSE1B and PULSE2B in response to a positive edge of the REFRESH input. Both PULSE1B and PULSE2B start simultaneously, but PULSE2B has a longer time duration that PULSE1B. Inverters 401 and 404, which are powered by the PWR node, receive PULSE1B and PULSE2B and generate PULSE1 and PULSE2, respectively.

In contrast to the circuit of FIG. 2, first NAND gate 410 is added between Schmitt trigger 211 and first SR latch 213, and second NAND gate is added between Schmitt trigger 212 and first SR latch 213. NAND gates 410 and 411 are powered by PWR and receive PULSE1B. During the PULSE1 event, the outputs of NAND gates 410 and 411 are both HIGH. Accordingly, first SR latch 213 holds its previous inverted $V_1G$ and non-inverted $V_2G$ outputs. It should be noted that, because NAND gates 410 and 411 add inversion operations, the inputs of Schmitt triggers 211 and 212 are switched if compared to the circuit of FIG. 2.

During a PULSE1 event, switch 406 decouples Vss from the source terminals of transistors 201, 204, 209, and 210. The PULSE1 signal is coupled to inverters 402 and 409. Inverter 402 is powered by $V_1$, and drives PMOS switch 403 coupled between $V_1$ and INV1. Similarly, inverter 409 drives PMOS switch 408 coupled between $V_2$ and INV2. If PULSE1 is HIGH, switches 403 and 408 are turned on to reset comparator 101 by pre-charging $INV_1$ and $INV_2$. Consequently, the comparator 101's hysteresis is reduced or eliminated.

OR gate 405 drives the gate of transistor 201 and receives PULSE2 and the V1G flag. Furthermore, OR gate 407 drives the gate of transistor 210 and receives PULSE2 and the $V_2G$ flag. During the PULSE2 event, transistors 201 and 210 are driven on to increase the strength of the equivalent NMOS transistors formed by 203/204 as well as 208/209. In this configuration, inverters 215 and 216 have a faster regeneration time.

In summary, pulse signals PULSE 1 and PULSE2 force first inverter 215 and second inverter 216 in equivalent conditions and decouple the ground reference $V_{SS}$ from the core of comparator circuit 101. When the ground reference $V_{SS}$ is re-coupled, comparator 101 is initially in a metastable condition, and the current through transistors 202 and 207 forces an accurate comparison by causing comparator 101 to latch according to the sign of the voltage difference between $V_1$ and $V_2$.

Figure 5:
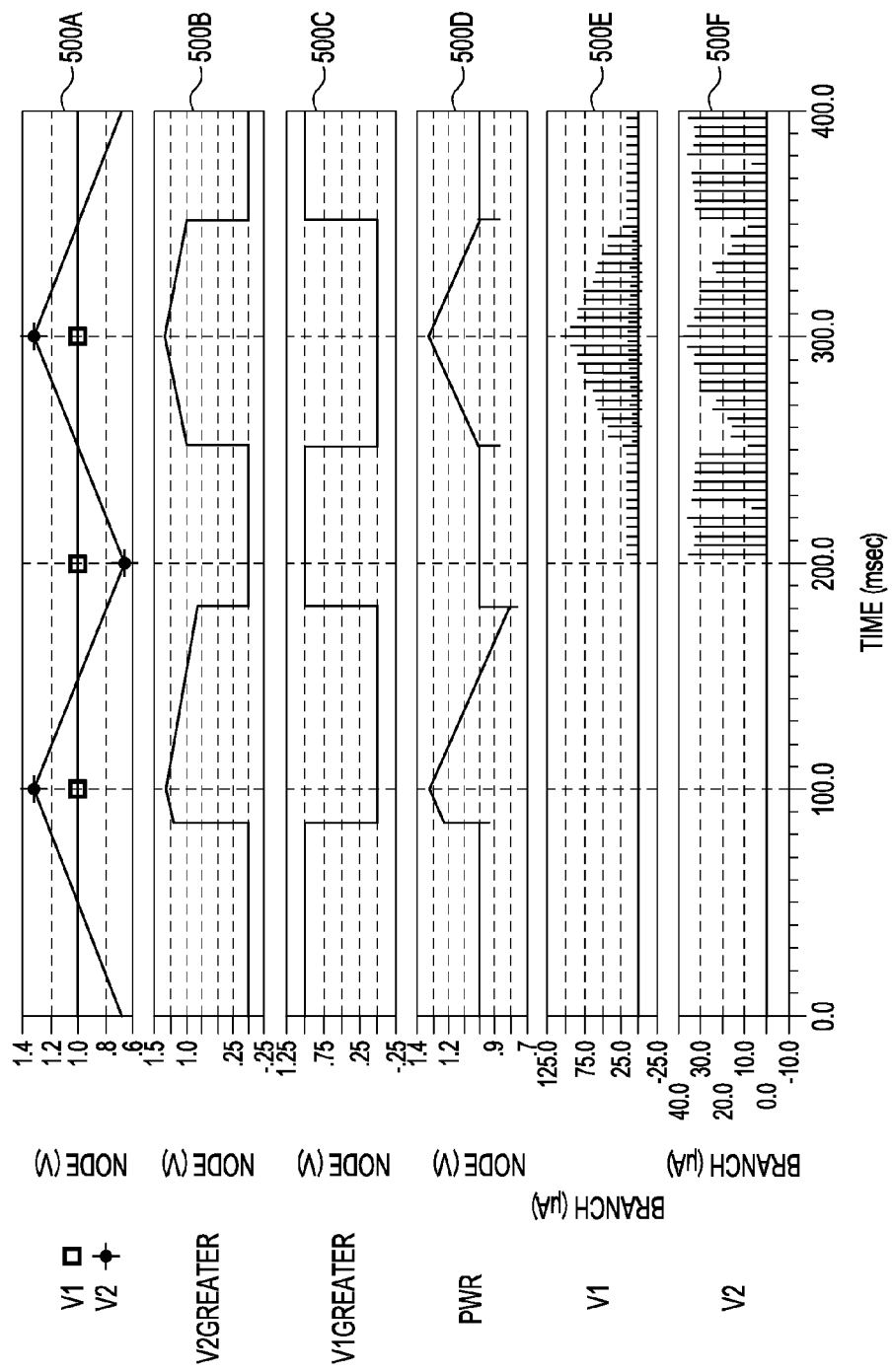
FIG. 5 shows graphs illustrating simulated waveforms output by the power monitoring circuit with offset reduction circuitry according to some embodiments.

FIG. 5 shows graphs illustrating simulated waveforms output by the power monitoring circuit with offset reduction circuitry of FIG. 4, according to some embodiments. In graph 500A, up until t=200 ms, the circuit is in the first mode of operation and behaves as the circuit of FIG. 2. Between t=200 ms and t=400 ms, the circuit is in its second mode of operation.

When in the second mode of operation, a clock signal is connected to the REFRESH input. Every time a positive clock edge occurs, an accurate comparison between $V_1$ and $V_2$ is performed. As shown in graphs 500B-500D, at t=250 ms $V_2$ becomes greater than $V_1$, V2GREATER is set to HIGH, V1GREATER is set to LOW, and the PWR node is tied to $V_2$ (the greater of $V_1$ and $V_2$) approximately immediately, or with a reduced time delay. Accordingly, here the voltage offset is nearly 0 V. It should be noted that, as shown in graphs 500E and 500F, current consumption increases momentarily, but it returns very quickly to almost zero, thus preserving the low static power consumption of the circuit.

FIG. 6 is a circuit diagram of an example of pulse generator 412 according to some embodiments. Here, all of the logic gates are powered by the PWR voltage. Inverter 601 receives the REFRESH signal and its output is coupled to resistor 602. The other terminal of resistor 602 is coupled to NAND gate 604. Capacitor 603 is coupled between the X node and the PWR node. NAND gate 604 also receives the REFRESH signal and outputs PULSE1B. When the REFRESH signal goes HIGH, the output of inverter 601 goes LOW but the voltage on node X decreases slowly due to the first RC network made up of resistor 602 and capacitor 603. During the short period of time when X and REFRESH are both HIGH, PULSE1B is LOW.

NAND gate 605 receives PULSE1B and REFRESH and its output is coupled to resistor 606. The other terminal of resistor 606 is connected to NAND gate 608. Capacitor 607 is coupled between the Y node and the PWR node. NAND gate 608 also receives the REFRESH signal, and it generates PULSE2B. During the period when PULSE1B is LOW, PULSE2B is also LOW. When PULSE1B returns to HIGH, the output of NAND gate 605 goes to LOW. However, the voltage on node Y decreases slowly due to the second RC network made up of resistor 606 and capacitor 607. During the short period of time when Y and REFRESH are both HIGH, PULSE2B is LOW.

In other words, the durations of PULSE1B and PULSE2B are controlled by the two RC networks as described above. Moreover, the cascade configuration of circuit 412 guarantees that the duration of PULSE2B is always longer than PULSE1B.

Figure 7:
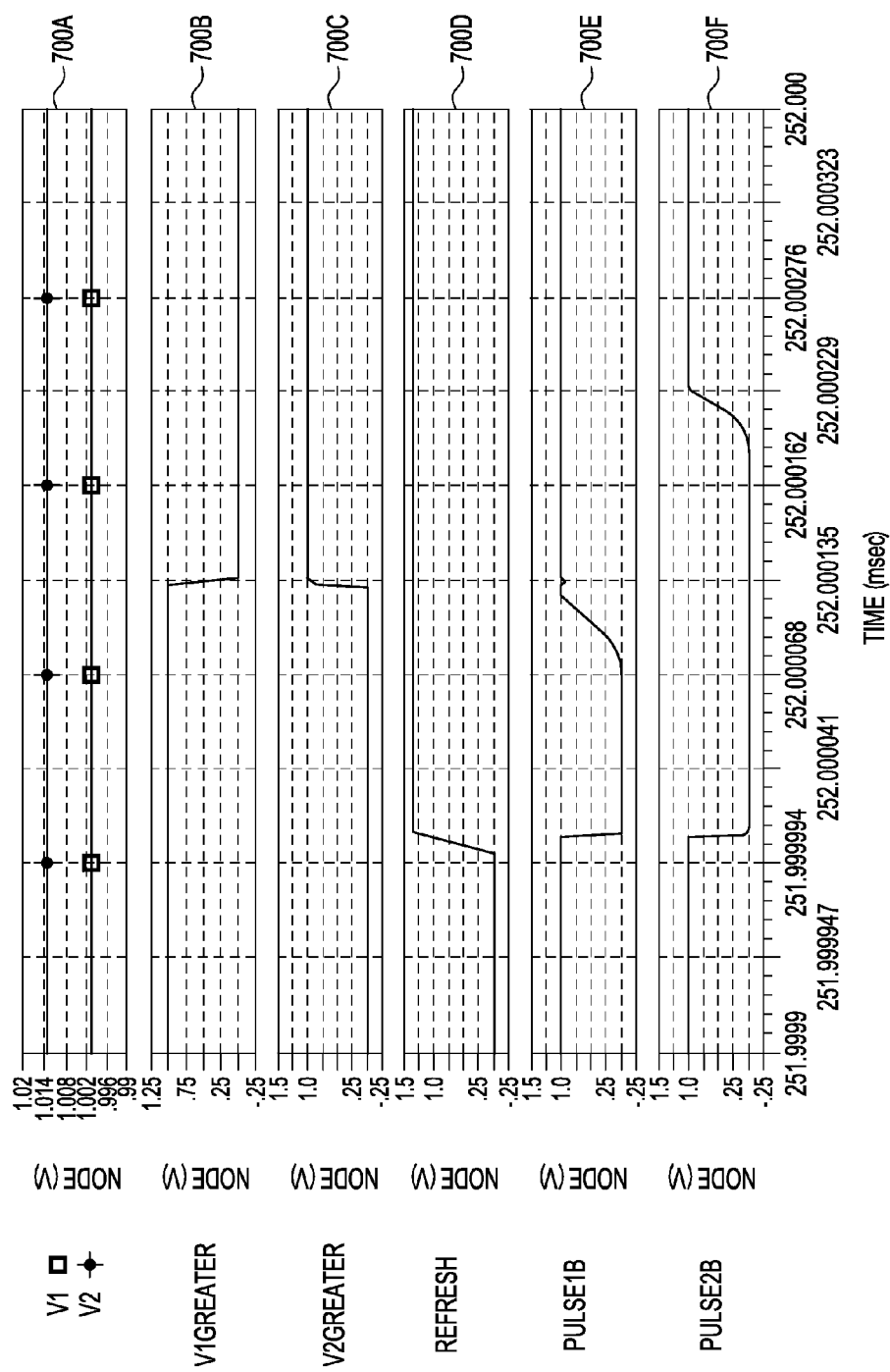
FIG. 7 shows graphs illustrating simulated output waveforms of a pulse generator according to some embodiments.

FIG. 7 shows graphs illustrating simulated output waveforms of pulse generator 412, according to some embodiments. Again, V1 and V2 are input voltages that vary arbitrarily over time, as shown in graph 700B. In graph 700D, when a positive edge of the REFRESH signal occurs, each of PULSE1B and PULSE 2B assumes a logic LOW value, as shown in graphs 700E and 700F. At the end of PULSE1B, comparator 101 is released and latches to the largest of $V_1$ or $V_2$, in this case $V_2$. Therefore, at some point between the end of PULSE1B and the end of PULSE2B, the V1GREATER flag of graph 700B goes LOW and the V2GREATER flag of graph 700C goes HIGH.

As will be understood by a person of ordinary skill in the art in light of the foregoing, a power monitoring circuit such as described herein may be such that leakage currents account for the majority or all of the circuit's static power consumption; which is otherwise zero or near-zero. In some cases, leakage currents may account for over 90% of the circuit's static power consumption. In other cases, leakage currents may account for over 95% of the circuit's static power consumption. In yet other cases, leakage currents may account for over 98% of the circuit's static power consumption. In still other cases, leakage currents may account for over 99% of the circuit's static power consumption.

In many implementations, the systems and methods disclosed herein may be incorporated into a wide range of electronic devices including, for example, computer systems or Information Technology (IT) products such as servers, desktops, laptops, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 8:
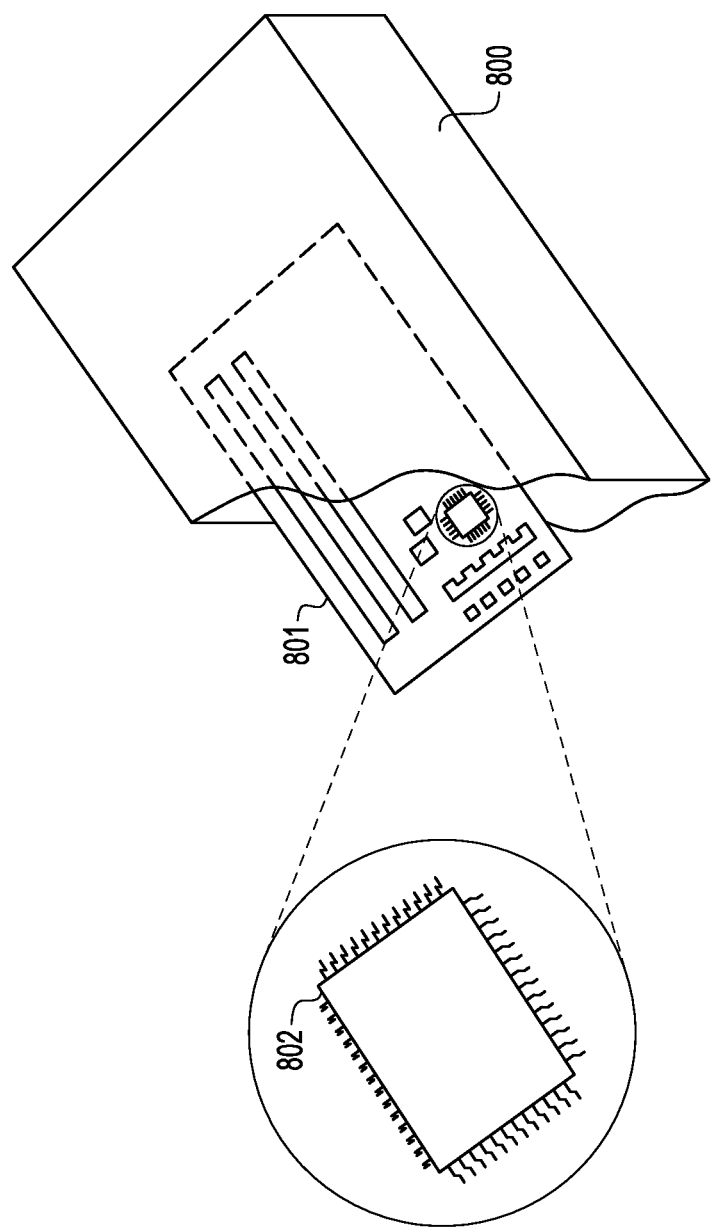
FIG. 8 is a diagram of an example of a Printed Circuit Board (PCB) of a device having one or more electronic chips, according to some embodiments.

Turning to FIG. 8, a block diagram of electronic device 800 is depicted. In some embodiments, electronic device 800 may be any of the aforementioned electronic devices, or any other electronic device. As illustrated, electronic device 800 includes one or more Printed Circuit Boards (PCBs) 801, and at least one of PCBs 801 includes one or more chips 802. In some implementations, one or more ICs within chip 802 may implement one or more power monitoring circuits such as those discussed above.

Examples of IC(s) that may be present within chip 802 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, IC(s) may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, IC(s) may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, IC(s) may include one or more Micro-ElectroMechanical Systems (MEMS), Nano-ElectroMechanical Systems (NEMS), or the like.

Accordingly, an IC within chip 802 may include a number of different portions, areas, or regions. These various portions may include one or more processing cores, cache memories, internal bus(es), timing units, controllers, analog sections, mechanical elements, etc. In various embodiments, these different portions, areas, or regions may each be in a different power domain, and therefore may each include one or more power monitoring circuits configured to select one of a plurality of supply voltages as being the highest or lowest of the plurality of supply voltages. Furthermore, each power monitoring circuit may be configured to make the selection while maintaining a zero or near-zero static power consumption.

Generally speaking, chip 802 may include an electronic component package configured to be mounted onto PCB 801 using any suitable packaging technology such as, for example, Ball Grid Array (BGA) packaging or the like. In some applications, PCB 801 may be mechanically mounted within or fastened onto electronic device 800. It should be noted that, in certain implementations, PCB 801 may take a variety of forms and/or may include a plurality of other elements or components in addition to chip 802. It should also be noted that, in some embodiments, PCB 801 may not be used.

Although the example of FIG. 8 shows electronic chip 802 in monolithic form, it should be understood that, in alternative embodiments, the systems and methods described herein may be implemented with discrete components. For example, in some cases, one or more logic gates, multiplexers, latches, flip-flops, etc. may be located outside of chip 802, and one or more of these external components may be operably coupled to an IC fabricated within chip 802.

As discussed above, in an illustrative, non-limiting embodiment, a monitoring circuit includes comparator circuitry configured to receive a first voltage value and a second voltage value, and to identify the greater of the first and second voltage values, and selector circuitry coupled to the comparator circuitry, the selector circuitry configured to power one or more components within the comparator circuitry with a supply voltage corresponding to the greater voltage value.

In some implementations, the comparator circuitry may have a first inverter cross-coupled with a second inverter, the first inverter configured to receive the first voltage value and the second inverter configured to receive the second voltage value. An output of the first inverter may be configured to be pulled up to the first voltage value and an output of the second inverter configured to be pulled down to a reference voltage value in response to the first voltage value being greater than the second voltage value. Additionally or alternatively, the output of the first inverter may be configured to be pulled down to a reference voltage value and an output of the second inverter configured to be pulled up to the second voltage value in response to the second voltage value being greater than the first voltage value.

In some embodiments, the one or more components include a first and a second Schmitt trigger, the first Schmitt trigger coupled to an output of the first inverter, and the second Schmitt trigger coupled to an output of the second inverter. Additionally or alternatively, the one or more components include a first latch having a reset input ($\overline{R}$) configured to receive an output of the first Schmitt trigger and a set input ($\overline{S}$) configured to receive an output of the second Schmitt trigger. Additionally or alternatively, the one or more components include a second latch having a set input ($\overline{S}$) configured to receive an output (Q) of the first latch and a reset input ($\overline{R}$) configured to receive a complementary output ($\overline{Q}$) of the first latch.

In some cases, an output (Q) of the second latch may be configured to assume a logic high value in response to the first voltage value being greater than the second voltage value, and a complementary output ($\overline{Q}$) of the second latch configured to assume a logic high value in response to the second voltage value being greater than the first voltage value. The output (Q) of the second latch may be configured to lower a trip point of the first inverter in response to the first voltage being greater than the second voltage. The complementary output ($\overline{Q}$) of the second latch may be configured to lower a trip point of the second inverter in response to the second voltage being greater than the first voltage.

In another illustrative, non-limiting embodiment, an electronic device includes a comparator circuit having a first inverter cross-coupled with a second inverter, the first inverter configured to receive a first voltage and the second inverter configured to receive a second voltage, wherein: (a) an output of the first inverter is configured to be pulled up to the first voltage and an output of the second inverter is configured to be pulled down to a reference voltage in response to the first voltage being greater than the second voltage, and (b) the output of the first inverter is configured to be pulled down to the reference voltage and the output of the second inverter is configured to be pulled up to the second voltage in response to the second voltage being greater than the first voltage. The electronic device also includes a switching circuit coupled to the comparator circuit, the switching circuit configured to: (a) provide the first voltage to one or more components within the comparator circuit in response to the first voltage being greater than the second voltage, and (b) provide the second voltage to the one or more components within the comparator circuit in response to the second voltage being greater than the first voltage.

The electronic device may also include a pulse generator circuit coupled to the comparator circuit, the pulse generator circuit configured to receive a refresh signal and to output a first pulse and a second pulse, the second pulse having a longer duration than the first pulse. For example, the first and second inverters may be configured to become decoupled from the reference voltage and the comparator circuit is configured to be reset during the first pulse. The first and second inverters may be configured to have their respective regeneration times decreased during the second pulse. The first and second inverters may also be configured to be coupled to the reference voltage during a time between the end of the first pulse and the end of the second pulse. Also, the comparator circuit may be configured to latch according to a sign of a voltage difference between the first voltage and the second voltage.

In yet another illustrative, non-limiting embodiment, a method includes identifying, via a comparator, the largest among a plurality of voltage values, and powering one or more logic components within the comparator with the identified voltage value. The method may also include comprising periodically decoupling one or more inverters within the comparator from a ground voltage. The method may further include periodically re-coupling the one or more inverters to the ground voltage to place the comparator in a metastable condition. In some implementations, the method may include biasing one or more transistors using the identified voltage value.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A monitoring circuit, comprising:
   comparator circuitry configured to identify the greater between a first voltage value and a second voltage value, wherein the comparator circuitry includes a first inverter cross-coupled with a second inverter, the first inverter configured to receive the first voltage value and the second inverter configured to receive the second voltage value; and
   selector circuitry coupled to the comparator circuitry, the selector circuitry configured to power one or more components within the comparator circuitry with a supply voltage corresponding to the identified voltage value, wherein the one or more components include a first Schmitt trigger coupled to an output of the first inverter and a second Schmitt trigger coupled to an output of the second inverter.

2. The monitoring circuit of claim 1, wherein the output of the first inverter is configured to be pulled up to the first voltage value and wherein the output of the second inverter is configured to be pulled down to a reference voltage value in response to the first voltage value being greater than the second voltage value.

3. The monitoring circuit of claim 1, wherein the output of the first inverter is configured to be pulled down to a reference voltage value and wherein the output of the second inverter is configured to be pulled up to the second voltage value in response to the second voltage value being greater than the first voltage value.

4. The monitoring circuit of claim 1, wherein the one or more components further include a first latch having a reset input ($\overline{R}$) configured to receive an output of the first Schmitt trigger and a set input ($\overline{S}$) configured to receive an output of the second Schmitt trigger.

5. The monitoring circuit of claim 4, wherein the one or more components further include a second latch having a set input ($\overline{S}$) configured to receive an output (Q) of the first latch and a reset input ($\overline{R}$) configured to receive a complementary output ($\overline{Q}$) of the first latch.

6. The monitoring circuit of the claim 5, an output (Q) of the second latch configured to assume a logic high value in response to the first voltage value being greater than the second voltage value, and a complementary output ($\overline{Q}$) of the second latch configured to assume a logic high value in response to the second voltage value being greater than the first voltage value.

7. The monitoring circuit of claim 6, the output (Q) of the second latch configured to lower a trip point of the first inverter in response to the first voltage being greater than the second voltage.

8. The monitoring circuit of claim 6, the complementary output ($\overline{Q}$) of the second latch configured to lower a trip point of the second inverter in response to the second voltage being greater than the first voltage.

9. An electronic device, comprising:
   a comparator circuit having a first inverter cross-coupled with a second inverter, the first inverter configured to receive a first voltage and the second inverter configured to receive a second voltage, wherein: (a) an output of the first inverter is configured to be pulled up to the first voltage and an output of the second inverter is configured to be pulled down to a reference voltage in response to the first voltage being greater than the second voltage, and (b) the output of the first inverter is configured to be pulled down to the reference voltage and the output of the second inverter is configured to be pulled up to the second voltage in response to the second voltage being greater than the first voltage;
   a switching circuit coupled to the comparator circuit, the switching circuit configured to:
      (a) provide the first voltage to one or more components within the comparator circuit in response to the first voltage being greater than the second voltage, and
      (b) provide the second voltage to the one or more components within the comparator circuit in response to the second voltage being greater than the first voltage; and
   a pulse generator circuit coupled to the comparator circuit, the pulse generator circuit configured to receive a refresh signal and to output a first pulse and a second pulse, the second pulse having a longer duration than the first pulse.

10. The electronic device of claim 9, wherein the first and second inverters are configured to become decoupled from the reference voltage and the comparator circuit is configured to be reset during the first pulse.

11. The electronic device of claim 10, wherein the first and second inverters are configured to have their respective regeneration times decreased during the second pulse.

12. The electronic device of claim 10, wherein the first and second inverters are configured to be coupled to the reference voltage during a time between the end of the first pulse and the end of the second pulse.

13. The electronic device of claim 12, wherein the comparator circuit is configured to latch according to a sign of a voltage difference between the first voltage and the second voltage.

14. A method, comprising:
   receiving, via a comparator circuit, a first voltage value and a second voltage value, wherein the comparator circuit includes a first inverter cross-coupled with a second inverter, the first inverter configured to receive the first voltage value and the second inverter configured to receive the second voltage value;
   identifying, via the comparator circuit, the largest between the first and second voltage values; and
   powering one or more components within the comparator circuit with a supply voltage selected by a selector circuit, wherein the supply voltage corresponds to the identified voltage value, and wherein the one or more components include a first and a second Schmitt trigger, the first Schmitt trigger coupled to an output of the first inverter, and the second Schmitt trigger coupled to an output of the second inverter.

15. The method of claim 14, further comprising periodically decoupling at least one of the first or second inverters within the comparator circuit from a ground voltage.

16. The method of claim 15, further comprising periodically re-coupling at least one of the first or second inverters to the ground voltage to place the comparator circuit in a metastable condition.

17. The method of claim 14, further comprising biasing one or more transistors using the identified voltage value.

* * * * *